United States Patent
Yamanaka (10) Patent No.: US 9,013,183 B2
(45) Date of Patent: Apr. 21, 2015

(54) MRI APPARATUS WITH ENERGY CONTROL VALUES AND AN SAR VALUE CALCULATED FROM A MODIFIED ENERGY CONTROL VALUE ACCORDING TO PLURAL IMAGING CONDITIONS SET BEFORE THE MRI ACQUISITION

(75) Inventor: Masaaki Yamanaka, Otawara (JP)

(73) Assignees: Kabushiki Kaisha Toshiba, Tokyo (JP); Toshiba Medical Systems Corporation, Otawara-Shi, Tochigi-Ken (JP)

(*) Notice: Subject to any disclaimer, the term of this patent is extended or adjusted under 35 U.S.C. 154(b) by 522 days.

(21) Appl. No.: 12/938,713

(22) Filed: Nov. 3, 2010

(65) Prior Publication Data
US 2011/0109312 A1 May 12, 2011

(30) Foreign Application Priority Data

Nov. 12, 2009 (JP) .................. 2009-258635
Sep. 6, 2010 (JP) .................. 2010-199175

(51) Int. Cl.
G01R 33/28 (2006.01)
G01R 33/34 (2006.01)
G01R 33/563 (2006.01)

(52) U.S. Cl.
CPC ........ G01R 33/288 (2013.01); *G01R 33/34046* (2013.01); *G01R 33/56375* (2013.01)

(58) Field of Classification Search
USPC .......................... 324/300–322; 600/407–435; 382/128–131; 250/252.1, 362
See application file for complete search history.

(56) References Cited

U.S. PATENT DOCUMENTS

| | | | | |
|---|---|---|---|---|
| 5,492,122 | A * | 2/1996 | Button et al. | 600/411 |
| 6,426,623 | B1 | 7/2002 | Bernstein | |
| 6,762,605 | B2 * | 7/2004 | Brinker et al. | 324/309 |
| 7,282,914 | B2 * | 10/2007 | Morich et al. | 324/318 |
| 7,622,921 | B2 * | 11/2009 | Fontius et al. | 324/307 |
| 8,017,906 | B2 * | 9/2011 | Nelson et al. | 250/252.1 |
| 8,188,435 | B2 * | 5/2012 | Podhajsky et al. | 250/362 |
| 8,319,496 | B2 * | 11/2012 | Eryaman et al. | 324/309 |
| 8,570,040 | B2 * | 10/2013 | Leigh et al. | 324/309 |
| 8,604,791 | B2 * | 12/2013 | Vaughan et al. | 324/318 |
| 8,653,818 | B2 * | 2/2014 | Adalsteinsson et al. | 324/309 |
| 2003/0080738 | A1 * | 5/2003 | Brinker et al. | 324/309 |
| 2007/0096735 | A1 * | 5/2007 | Morich et al. | 324/318 |
| 2008/0157765 | A1 * | 7/2008 | Fontius et al. | 324/309 |
| 2010/0253338 | A1 * | 10/2010 | Eryaman et al. | 324/309 |
| 2010/0270462 | A1 * | 10/2010 | Nelson et al. | 250/252.1 |
| 2011/0043205 | A1 * | 2/2011 | Graesslin et al. | 324/307 |
| 2011/0109312 | A1 * | 5/2011 | Yamanaka | 324/309 |
| 2011/0118587 | A1 * | 5/2011 | Roemer et al. | 600/411 |

(Continued)

FOREIGN PATENT DOCUMENTS

JP 7-246194 9/1995

*Primary Examiner* — Melissa Koval
*Assistant Examiner* — Tiffany Fetzner
(74) *Attorney, Agent, or Firm* — Nixon & Vanderhye P.C.

(57) ABSTRACT

An MRI apparatus includes an image generating unit and an SAR calculating unit. The image generating unit receives a magnetic resonance signal generated as a result of transmission of an RF pulse from an object, and generates image data of the object based on the magnetic resonance signal. The SAR calculating unit performs a correction operation on an energy control value of the RF pulse according to an imaging condition, and calculates an SAR value based on an energy value subjected to the correction operation.

18 Claims, 7 Drawing Sheets

(56) References Cited

U.S. PATENT DOCUMENTS

| | | |
|---|---|---|
| 2011/0148411 A1* | 6/2011 | Bottomley et al. ........... 324/309 |
| 2011/0301450 A1* | 12/2011 | Hue et al. ...................... 600/411 |
| 2011/0316539 A1* | 12/2011 | Lagendijk et al. ............ 324/318 |
| 2012/0062230 A1* | 3/2012 | Vaughan et al. .............. 324/318 |
| 2012/0086449 A1* | 4/2012 | Graesslin et al. ............. 324/309 |
| 2012/0169336 A1* | 7/2012 | Leigh et al. ................... 324/309 |
| 2012/0223709 A1* | 9/2012 | Schillak et al. ............... 324/309 |
| 2012/0256626 A1* | 10/2012 | Adalsteinsson et al. ...... 324/309 |
| 2013/0023753 A1* | 1/2013 | Kawamura et al. ........... 600/410 |
| 2013/0063143 A1* | 3/2013 | Adalsteinsson et al. ...... 324/307 |
| 2013/0123885 A1* | 5/2013 | Zhu et al. ...................... 607/100 |
| 2014/0012063 A1* | 1/2014 | Turner et al. .................... 600/10 |
| 2014/0015547 A1* | 1/2014 | Bottomley et al. ........... 324/647 |
| 2014/0097846 A1* | 4/2014 | Lemaire et al. ............... 324/322 |
| 2014/0340084 A1* | 11/2014 | Alon .............................. 324/309 |
| 2014/0370929 A1* | 12/2014 | Khawand et al. ............. 455/522 |

* cited by examiner

FIG. 6(a) OUTPUT OF RF PULSES

FIG. 6(b) ABSORPTION TO WHOLE-BODY

FIG. 6(c) ABSORPTION TO HEAD

FIG. 6(d) ABSORPTION TO PARTIAL BODY

FIG. 7

FIG. 8(a) (PRIOR ART) — OUTPUT OF RF PULSES

FIG. 8(b) (PRIOR ART) — ABSORPTION TO WHOLE-BODY

FIG. 8(c) (PRIOR ART) — ABSORPTION TO HEAD

FIG. 8(d) (PRIOR ART) — ABSORPTION TO PARTIAL BODY

MRI APPARATUS WITH ENERGY CONTROL VALUES AND AN SAR VALUE CALCULATED FROM A MODIFIED ENERGY CONTROL VALUE ACCORDING TO PLURAL IMAGING CONDITIONS SET BEFORE THE MRI ACQUISITION

CROSS-REFERENCE TO RELATED APPLICATIONS

This application is based upon and claims the benefit of priority from Japanese Patent Application No. 2009-258635, filed on Nov. 12, 2009 and No. 2010-199175 filed on Sep. 6, 2010;

The entire contents of which are incorporated herein by reference.

BACKGROUND

1. Field

Embodiments described herein relate generally to an MRI (magnetic resonance imaging) apparatus and an MRI method.

Additionally, embodiments described herein relate to technology to limit energy of RE (radio frequency) pulses transmitted by an MRI apparatus to an object.

2. Description of the Related Art

MRI is an imaging method which magnetically excites nuclear spin of an object (a patient) set in a static magnetic field with an RF pulse having the Larmor frequency and reconstructs an image based on NMR (nuclear magnetic resonance) signals generated due to the excitation.

In MRI, an RF coil is used to transmit an RF pulse to an imaging region to cause nuclear magnetic resonance. The resonance frequency of the RF pulse is proportional to the intensity of the static magnetic field of the MRI apparatus. For example, in the case of a static magnetic field of 1.5 tesla, the resonance frequency is 63.8 MHz. The RF pulse at this frequency causes an increase in temperature of the body of the object. Therefore, from the viewpoint of safety, the International Electrotechnical Commission (IEC) standard or other standard prescribe the upper limit of the energy of the RF pulse transmitted to the object.

Specifically, energy of the RF pulse absorbed by 1 kg of living tissue is referred to as a specific absorption ratio (SAR). It is prescribed that an SAR value for an arbitrarily set period of 10 seconds and an SAR value for an arbitrarily set period of 6 minutes do not exceed a first upper limit and a second upper limit, respectively. The upper limit of the SAR value varies depending on the imaging region, such as the whole body and the head.

To satisfy the safety standard concerning SAR, according to a conventional technique disclosed in U.S. Pat. No. 6,426, 623, a sum of the energy values of the RF pulses transmitted to the object is calculated for each of the preceding 1 second, the preceding 5 seconds and the preceding 10 seconds.

And the RF pulse generator is stopped if any of the following three cases occurs. A first case is that the sum for the preceding 1 second exceeds a first predetermined value. A second case is that the sum for the preceding 5 seconds exceeds a second predetermined value. A third case is that the sum for the preceding 10 seconds exceeds a third predetermined value.

The conventional measure for safety surely prevents the actual dose from exceeding the upper limit of SAR. As a result, imaging can be performed under a safer condition than is required when the SAR value actually has a margin with respect to the upper limit. When the SAR value has a margin with respect to the upper limit, imaging can be performed under a more suitable condition by increasing the irradiation intensity or the number of slices in accordance with the margin, for example. Thus, in order to perform imaging under more suitable condition, there is a demand for a technique of determining SAR with higher accuracy.

DETAILED DESCRIPTION

One embodiment of the present invention aims to provide MRI technology to calculate SAR more accurately than the conventional art, but the present invention is not limited to this aim.

According to one embodiment, a magnetic resonance imaging apparatus includes an image generating unit and an SAR calculating unit. The image generating unit receives a magnetic resonance signal generated as a result of transmission of an RF pulse from an object, and generates image data of the object based on the magnetic resonance signal. The SAR calculating unit performs a correction operation on an energy control value of the RF pulse according to an imaging condition, and calculates an SAR value based on an energy value subjected to the correction operation.

According to one embodiment, a magnetic resonance imaging method includes the steps of:

(a) receiving a magnetic resonance signal generated as a result of transmission of an RF pulse from an object;

(b) generating image data of the object based on the magnetic resonance signal;

(c) performing a correction operation on an energy control value of the RF pulse according to an imaging condition; and (d) calculating an SAR value based on an energy value subjected to the correction operation.

A magnetic resonance imaging apparatus and a magnetic resonance imaging method according to embodiments of the present invention will be described with reference to the accompanying drawings.

Note that the same reference numbers are given for identical components in each figure, and overlapping explanation is abbreviated.

(Configuration and Function)

Figure 1:
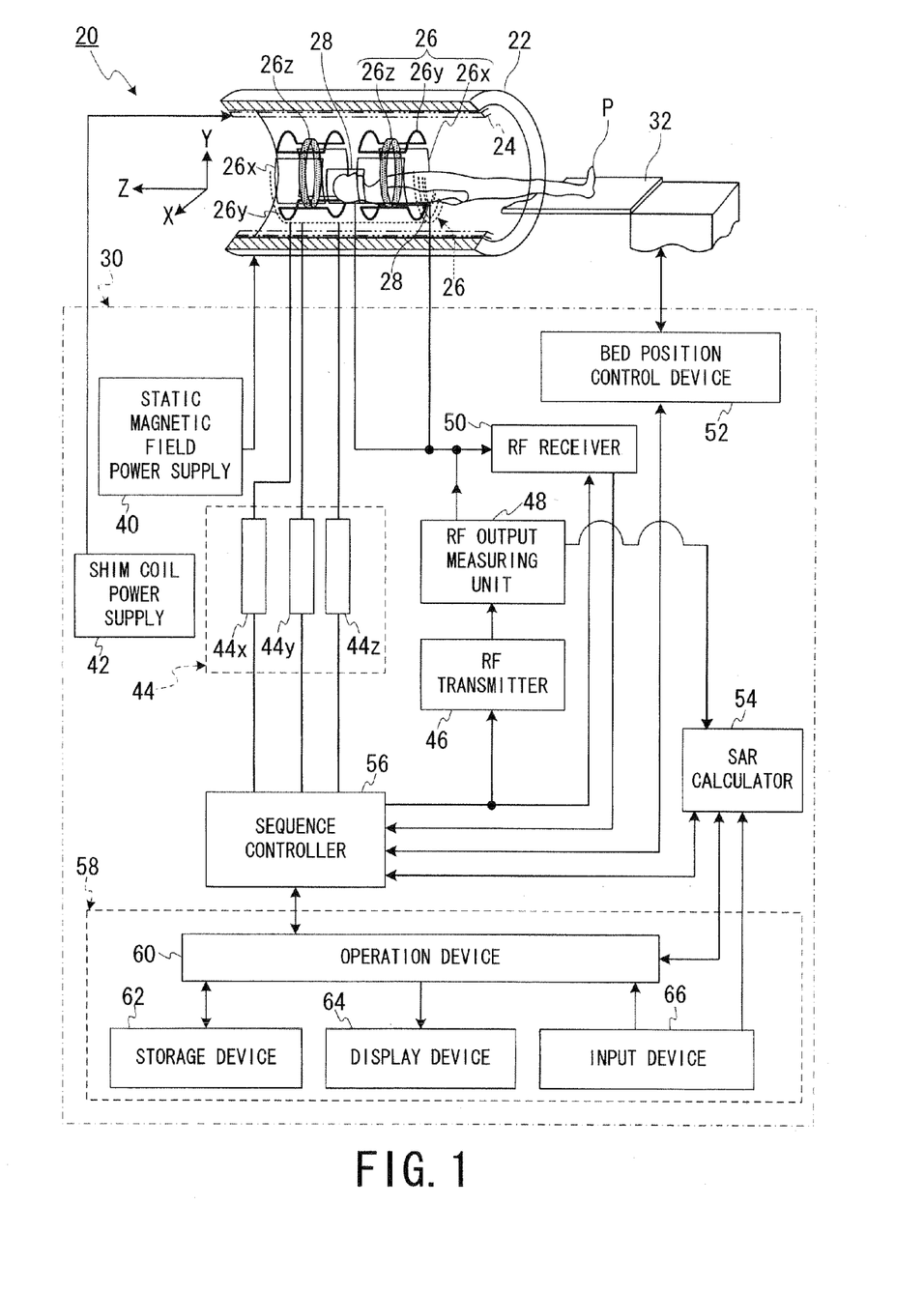
FIG. 1 is a block diagram showing general structure of a magnetic resonance imaging apparatus according to an embodiment of the present invention.

FIG. 1 is a block diagram showing general structure of a magnetic resonance imaging apparatus 20 according to an embodiment of the present invention.

A magnetic resonance imaging apparatus 20 includes a cylinder-shaped static magnetic field magnet 22 for generating a static magnetic field, a cylinder-shaped shim coil 24 arranged inside the static magnetic field magnet 22, a gradient coil 26, RF coils 28, a control system 30, and a bed 32 for placing an object(e.g. a patient) P on it.

As one example, the following description will be made on the assumption that an X axis, a Y axis and a Z axis are perpendicular to each other, and the direction of the Y axis is the same as the vertical direction (see FIG. 1). In addition, it is assumed that the bed 32 is disposed in such a position that a surface thereof on which a table is mounted is perpendicular to the Y axis, and the direction of an axis of a static magnetic field magnet 22 and a shim coil 24 is aligned with the direction of the Z axis. In addition, it is assumed that the direction of the X axis is the direction that is perpendicular to the direction of the Z axis and parallel with the surface of the bed 32 on which the table is mounted.

The control system 30 includes a static magnetic field power supply 40, a shim coil power supply 42, a gradient magnetic field power supply 44, an RF transmitter 46, an RF output measuring unit 48, an RF receiver 50, a bed position control device 52, SAR calculator 54, a sequence controller 56 and a computer 58.

The gradient magnetic field power supply 44 includes an X-axis gradient magnetic field power supply 44x, a Y-axis gradient magnetic field power supply 44y and a Z-axis gradient magnetic field power supply 44z.

The computer 58 includes an operation device 60, a storage device 62, a display device 64, and an input device 66. Note that performance of the SAR calculator 54, which is one of the characteristics of the present embodiment, will be described later.

The static magnetic field magnet 22 is electrically connected to the static magnetic field power supply 40 and has a function to generate a static magnetic field in an imaging space by using electric current supplied from the static magnetic field power supply 40. The shim coil 24 is electrically connected to the shim coil power supply 42 and uniforms the static magnetic field with the electric current supplied from the shim coil power supply 42.

The static magnetic field magnet 22 includes a superconductivity coil in many cases. The static magnetic field magnet 22 gets electric current from the static magnetic field power supply 40 at excitation. However, once excitation has been made, the static magnetic field magnet 22 is usually isolated from the static magnetic field power supply 40. The static magnetic field magnet 22 may include a permanent magnet which makes the static magnetic field power supply 40 unnecessary.

The gradient coil 26 includes an X-axis gradient coil 26x, a Y-axis gradient coil 26y and a Z-axis gradient coil 26z. Each of the X-axis gradient coil 26x, the Y-axis gradient coil 26y and the Z-axis gradient coil 26z is cylinder-shaped and arranged inside the static magnetic field magnet 22.

The X-axis gradient coil 26x, the Y-axis gradient coil 26y and the Z-axis gradient coil 26z are electrically connected to the X-axis gradient magnetic field power supply 44x, the Y-axis gradient magnetic field power supply 44y and the Z-axis gradient magnetic field power supply 44z of the gradient magnetic field power supply 44 respectively.

The X-axis gradient magnetic field power supply 44x, the Y-axis gradient magnetic field power supply 44y and the Z-axis gradient magnetic field power supply 44z supply electric current to the X-axis gradient coil 26x, the Y-axis gradient coil 26y and the Z-axis gradient coil 26z respectively so as to generate a gradient magnetic field Gx in the X-axis direction, a gradient magnetic field Gy in the Y-axis direction and a gradient magnetic field Gz in the Z-axis direction in the imaging space.

The RF transmitter 46 generates RF pulses in accordance with control information provided from the sequence controller 56, and outputs the generated RF pulses to the transmission RF coil 28.

The RF output measuring unit 48 is connected between the RF transmitter 46 and the transmission RF coil 28 in series. The RF output measuring unit 48 transfers the RF pulses outputted from the RF transmitter 46 towards the transmission RF coil 28. In this transmission operation, the RF output measuring unit 48 also measures energy value (energy control value) of an RF pulse and inputs the measured value to the SAR calculator 54.

The RF coils 28 include a WBC (whole body coil) built in the gantry for transmission and reception of RF pulses and local coils arranged around the bed 32 or the object P for reception of RF pulses.

The transmission RF coil 28 transmits an RF pulse given from the RF transmitter 46 via the RF output measuring unit 48 to the object P. The reception RF coil 28 receives an NMR signal generated due to excited nuclear spin inside the object P by the RF pulse and this NMR signal is detected by the RF receiver 50.

The RF receiver 50 generates raw data which are digitized complex number data obtained by performing predetermined signal processing and A/D (analogue to digital) conversion to the detected NMR signal, and inputs the generated raw data to the sequence controller 56.

The operation device 60 performs system control of the magnetic resonance imaging apparatus 20 in imaging operation. In this system control, the operation device 60 reflects imaging conditions inputted to the input device 66 by an operator and displays imaging conditions on the display device 64.

Additionally, the operation device 60 performs 2-dimensional Fourier transformation on raw data inputted from the sequence controller 56, and thereby generates image data of MR (magnetic resonance) images of each slices of the object P. The operation device 60 displays MR images after imaging based on those image data on the display device 64.

The sequence controller 56 is electrically connected to the gradient magnetic field power supply 44, the RF transmitter 46, the RF receiver 50, the bed position control device 52, the SAR calculator 54, and the operation device 60. The sequence controller 56 storages control information needed in order to make the gradient magnetic field power supply 44, the RF transmitter 46 and the RF receiver 50 drive. The aforementioned control information includes, for example, sequence information describing operation control information such as intensity, impression period and impression timing of the pulse electric current which should be impressed to the gradient magnetic field power supply 44.

The sequence controller 56 generates the gradient magnetic fields Gx, Gy and Gz in the X-axis, Y-axis and Z-axis directions and RF pulses by driving the gradient magnetic field power supply 44, the RF transmitter 46 and the RF receiver 50 according to a predetermined sequence stored. Additionally, the sequence controller 56 receives raw data of an NMR signal inputted from the RF receiver 50, and input the raw data to the operation device 60.

A bed position control device 52 is connected to an operation device 60 via a sequence controller 56 and moves the table on the bed 32 under the control of the operation device 60. This allows imaging according to "moving-table method" or "stepping-table method".

The moving-table method is designed to widen the field of view (FOV) in the direction of movement by continuously moving the table on the bed 32 during imaging.

The stepping-table method is designed to achieve three-dimensional (3D) imaging by moving the table on the bed 32 in a stepped manner for each station.

These techniques are used for imaging of a wide area that cannot be imaged at once, such as imaging of the whole body. The operation device 60 also has a capability of combining a plurality of images taken by moving the bed 32 into a composite image.

Figure 2:
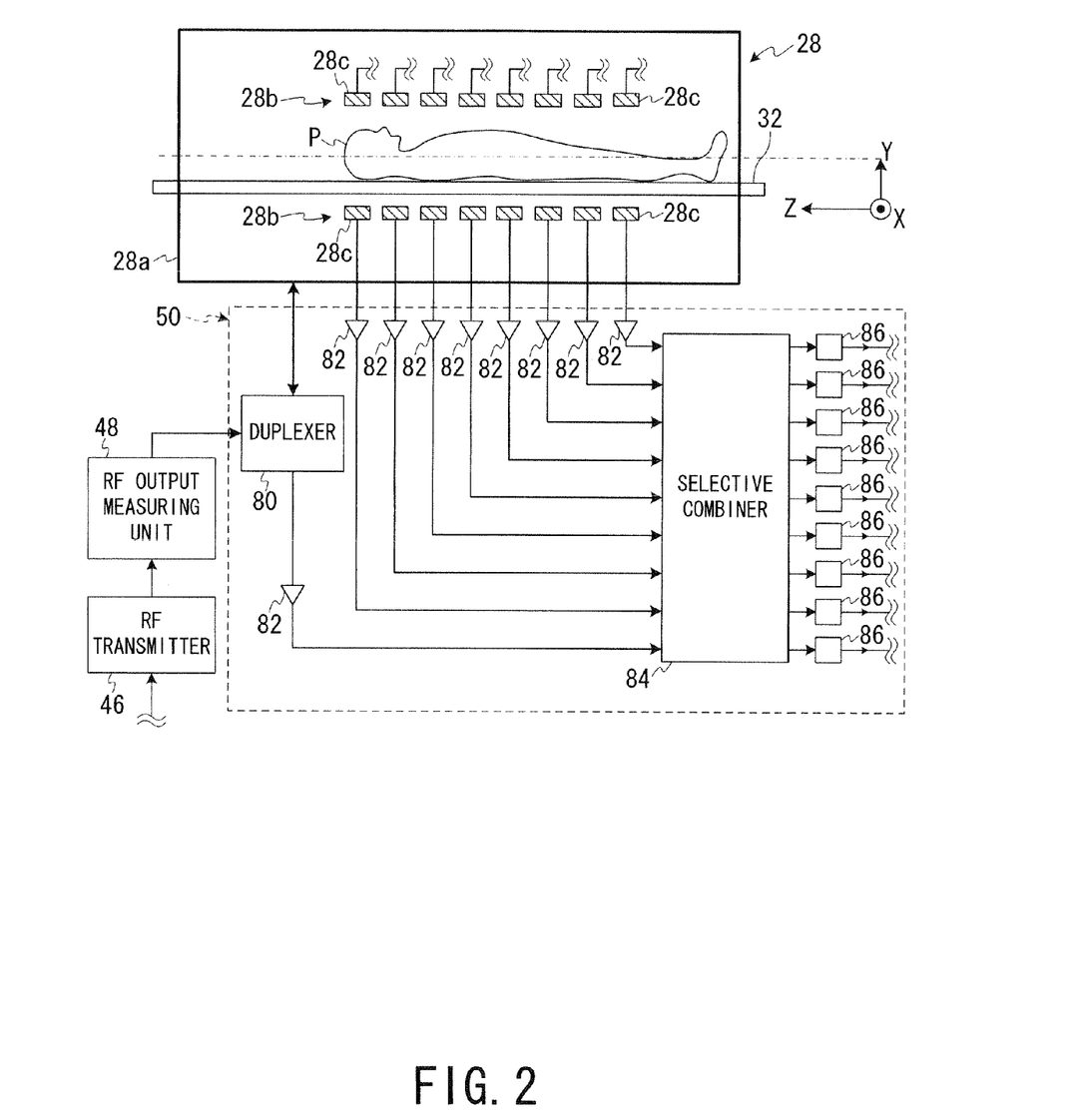
FIG. 2 shows an exemplary configuration of RF coils in FIG. 1 in detail.

FIG. 2 shows an exemplary configuration of RF coils 28 in detail. As shown in this drawing, the RF coils 28 include a cylinder-shaped whole body coil 28*a* (shown as a rectangle by a bold line in the drawing) and a phased array coil 28*b*. The whole body coil 28*a* can be used as a coil for transmitting an RF pulse and a coil for receiving an NMR signal.

The phased array coil 28*b* includes a large number of coil elements 28*c* disposed both on the front side and the back side of the object P (shown as shaded rectangles). Each coil element 28*c* is used as a coil for receiving an NMR signal. An exemplary arrangement of the coil elements 28*c* will be described later with reference to FIGS. 3 and 4.

An RF receiver 50 includes a duplexer 80, a plurality of amplifiers 82, a selective combiner 84, and a plurality of receiving-system circuits 86. The selective combiner 84 is connected on the input side to the separate coil elements 28*c* and the whole body coil 28*a* via the amplifiers 82. The receiving-system circuits 86 are individually connected to the output side of the selective combiner 84.

The duplexer 80 receives an RF pulse from an RF transmitter 46 via an RF output measuring unit 46 and provides the RF pulse to the whole body coil 28*a*. In addition, the duplexer 80 inputs an NMR signal received by the whole body coil 28*a* to the amplifier 82, and the NMR signal is amplified by the amplifier 82 and then provided to the input side of the selective combiner 84. NMR signals received by the coil elements 28*c* are also amplified by their respective amplifiers 82 and then provided to the input side of the selective combiner 84.

The selective combiner 84 performs selection and synthesis of the NMR signals detected by the coil elements 28*c* and the whole body coil 28*a* depending on the number of the receiving-system circuits 86 and outputs the resulting signals to corresponding receiving-system circuits 86 respectively. In this way, an MRI apparatus 20 produces a sensitivity distribution suitable for each imaging region using the whole body coil 28*a* and a desired number of coil elements 28*c* and receives NMR signals from various imaging regions.

Figure 3:
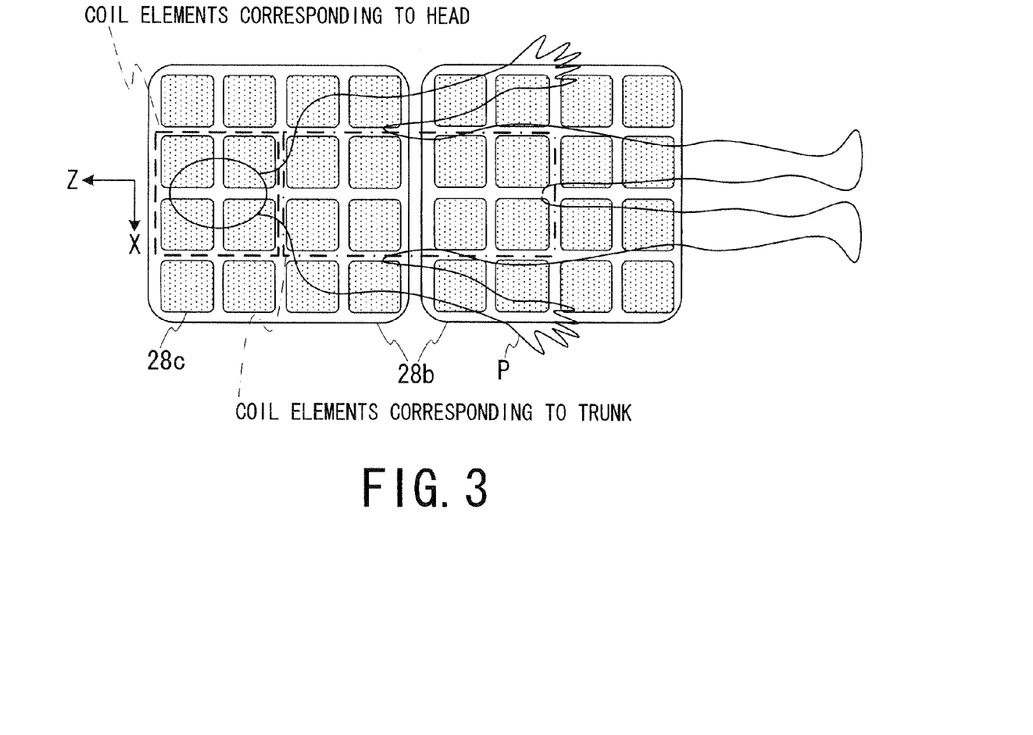
FIG. 3 is a schematic plan view showing an exemplary arrangement of the coil elements provided on the front side of the body of the object.

FIG. 3 is a schematic plan view showing an exemplary arrangement of the coil elements 28*c* provided on the front side of the body of the object P.

Figure 4:
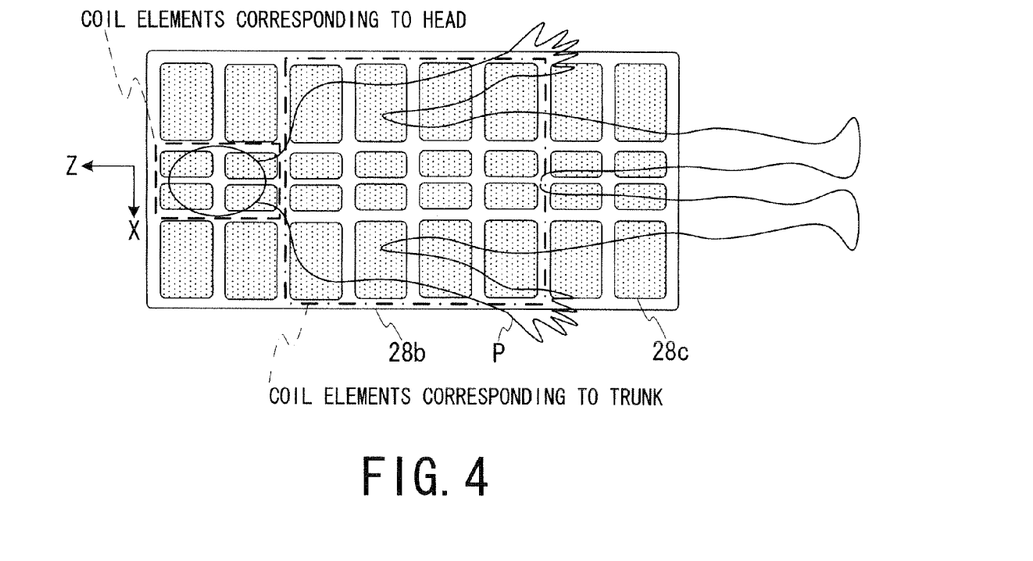
FIG. 4 is a schematic plan view showing an exemplary arrangement of the coil elements provided on the back side of the body of the object.

FIG. 4 is a schematic plan view showing an exemplary arrangement of the coil elements 28*c* provided on the back side of the body of the object P.

In FIG. 3, the coil elements 28*c* are shown as approximately square dotted regions. In FIG. 4, the coil elements 28*c* are shown as approximately rectangular dotted regions.

For example, on the front side of the body of the object P, as shown in FIG. 3, a total of 32 coil elements 28*c*, including four columns of coil elements 28*c* in the X axis direction and eight rows of coil elements 28*c* in the Z directions, are arranged to cover a wide area to be imaged.

As shown in FIG. 4, on the back side of the body of the object P, a total of 32 coil elements 28*c*, including four columns of coil elements 28*c* in the X axis direction and eight rows of coil elements 28*c* in the Z directions, are arranged to cover a wide area to be imaged similarly.

In this example, on the back side of the body of the object P, in order to consider the presence of the backbone of the object P to improve the sensitivity, coil elements 28*c* located close to the body axis are smaller than the other coil elements 28*c*.

The four coil elements 28*c* enclosed by a dashed line in FIGS. 3 and 4 are primarily used for imaging of the head. And "the eight coil elements 28*c* enclosed by an alternate long and short dash line in FIG. 3" and "the sixteen coil elements 28*c* enclosed by an alternate long and short dash line in FIG. 4" are primarily used for imaging of the trunk.

Figure 5:
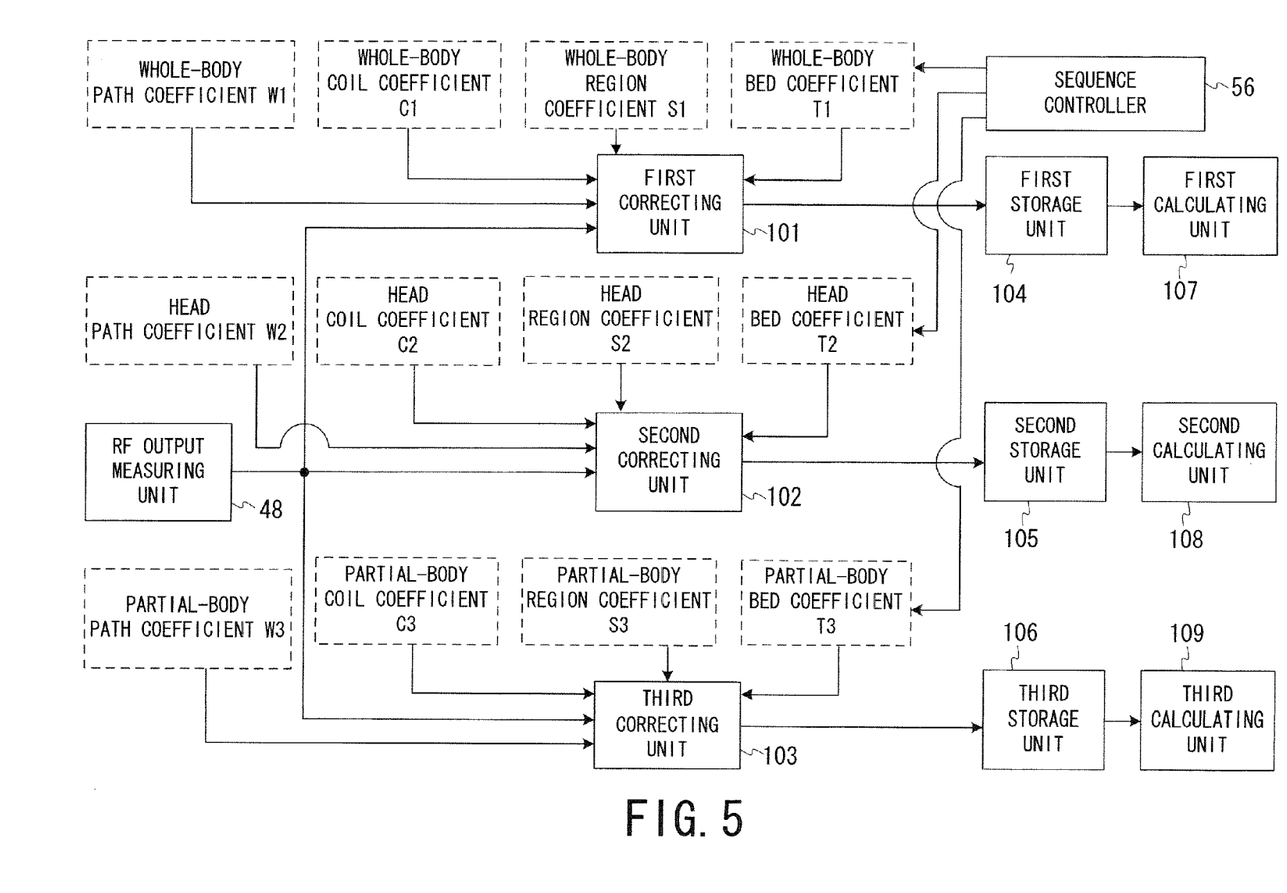
FIG. 5 is a signal block diagram showing an SAR calculation process in the present embodiment.

FIG. 5 is a signal block diagram showing an SAR calculation process performed by the SAR calculator 54, which is one of the characteristics of the present exemplary embodiment. In FIG. 5, coefficients used in the SAR calculation process are shown in dashed-line blocks, and components of the MRI apparatus 20 are shown in solid-line blocks.

As shown in the drawing, the SAR calculator includes a first correcting unit 101, a second correcting unit 102, a third correcting unit 103, a first storage unit 104, a second storage unit 105, a third storage unit 106, a first calculating unit 107, a second calculating unit 108 and a third calculating unit 109.

The first correcting unit 101, the first storage unit 104 and the first calculating unit 107 are used to calculate an SAR value of the whole body.

The second correcting unit 102, the second storage unit 105 and the second calculating unit 108 are used to calculate an SAR value of the head.

The third correcting unit 103, the third storage unit 106 and the third calculating unit 109 are used to calculate an SAR value of a body part.

(Description of Operation)

FIG. 6 is a timing chart showing exemplary time variations of "RF pulse energy" and "the value of the energy absorbed by parts of the object P". The signal level of actual RF pulses alternately changes sign from plus to minus and from minus to plus.

Therefore, in FIG. 6, the amplitude of the RF pulses is squared, and the width in the vertical direction in the drawing is regarded as the pulse intensity (RF pulse energy).

FIG. 6(*a*) shows the output intensity (energy control value) of RF pulses measured by the RF output measuring unit 48. The RF pulses include 90° pulses and 180° inverted pulses that are alternately output.

FIG. 6(*b*) shows the energy of RF pulses absorbed by the whole body of the object P, FIG. 6(*c*) shows the energy of RF pulses absorbed by the head of the object P, and FIG. 6(*d*) shows the energy of RF pulses absorbed by a body part of the object P.

In this embodiment, it is assumed that the body part is the trunk of the object P, for example. In addition, FIGS. 6 (*a*)-(*d*) show a case where the bed 32 moves further into a gantry in the Z-axis direction at times t1 and t2 and does not move at any points in time other than t1 and t2.

In the following, according to the flow the signal block diagram of FIG. 5, "the SAR calculation process" and "correcting process for imaging conditions of the next scan" according to this embodiment will be described by referring to FIG. 6 as required.

In the following description, it is assumed that the coil elements 28c are positioned with respect to the object P on the bed 32 as shown in FIGS. 3 and 4 at the time of start of imaging, for example Furthermore, the term "scan" used herein means a data acquisition sequence including applying a static magnetic field and a gradient magnetic field, transmitting an RF pulse, receiving an NMR signal, performing a predetermined processing on the NMR signal, and storing the processed NMR signal (see Step S2 in FIG. 7 described later). That is, the "scan" process does not include image reconstruction processing.

First, when a scan is started and the RF transmitter 46 starts outputting RF pulses, the RF output measuring unit 48 sequentially measures the energy value of the RF pulses at predetermined time intervals, and sequentially inputs the measurement values to the first correcting unit 101, the second correcting unit 102 and the third correcting unit 103.

Since the energy value of the RF pulses varies every 1 microsecond, for example, the energy value of the RF pulses is preferably measured at such short time intervals in order to ensure measurement accuracy. In this case, however, the amount of data is enormous, and the measurement load is heavy. Therefore, if the RF output measuring unit 48 can calculate the temporal integral value of the energy over a predetermined time interval (100 milliseconds, for example), the energy value can be measured at the predetermined time intervals.

At the same time, a sequence controller 56 inputs the latest position information for the bed 32 to the first correcting unit 101, the second correcting unit 102 and the third correcting unit 103 each time the position of the bed 32 changes in response to a command from the operation device 60.

The first correcting unit 101 performs a correction operation by multiplying "the energy value of each of the RF pulses sequentially inputted thereto at the predetermined time intervals" by a path coefficient W1, a coil coefficient C1, a region coefficient S1 and a bed coefficient T1. And the first correcting unit 101 sequentially inputs the corrected energy value and the position information on the bed 32 to the first storage unit 104. Note that all the coefficients used in this embodiment assume a value greater than 0 and smaller than 1.

The path coefficient W1 is a value that is involved in measurement of the whole body and primarily reflects attenuation of the energy of the RF pulses along the path from the RF transmitter 46 to a transmitting RF coil 28 for the whole body. The path coefficient W1 can be previously determined by actual measurement or previously calculated from the circuit configuration of the MRI apparatus 20 before imaging is started, for example.

The coil coefficient C1 is a value that is involved in measurement of the whole body and reflects consumption of the electrical power (attenuation of the energy) of the RF pulses in the whole body coil 28a or the coil elements 28c.

The region coefficient S1 is a coefficient of energy attenuation that is involved in measurement of the whole body. Since SAR is an electromagnetic energy absorbed per unit mass and unit time by a living tissue, these coefficients are used to consider a variation in absorption ratio of electromagnetic energy with the materials forming a tissue or the proportions of water, protein and the like in the tissue and consider the mass of the tissue.

The bed coefficient T1 is a value to consider attenuation of the energy of the RF pulses that depends on the position of the bed 32. More specifically, the bed coefficient T1 is a value to consider the fact that the electromagnetic wave of the RF pulses disperses and is less likely to reach(to be successfully transmitted to) the object P as the distance between the object P and the whole body coil 28a or the coil elements 28c increases.

The first storage unit 104 stores, as intermediate data, "the corrected energy value (i.e. the energy value after the correction operation)" and "the position of the bed 32" every measurement time. The energy value after correction operation is preferably converted into a reduced value as described below, for example, before being stored as intermediate data. For example, the reduced value may be a percentage of "the corrected energy value" with respect to the upper limit of the SAR value for a period of 6 minutes prescribed by the safety standard (the upper limit is assumed as a reference or 100%). In this embodiment, the corrected energy value is converted into such a reduced value before being stored as intermediate data, for example.

Note that the upper limit of the SAR value for a period of 10 seconds prescribed by the safety standard is three times as high as (300% of) the upper limit of the SAR value for a period of 6 minutes, for example. If the corrected energy value is stored in the form of a reduced value on the assumption that the upper limit of the SAR value is 100% in this way, the upper limit of the SAR value itself does not have to be stored.

At the predetermined time intervals, the first calculating unit 107 sequentially calculates "the SAR value for 10 seconds just before the current time (current reference time)" and "the SAR value for 6 minutes just before the current reference time", for example, by using the intermediate data stored in the first storage unit 104. The first calculating unit 107 sequentially inputs the calculation results to the operation device 60 as SAR values of the whole body for periods of 10 seconds and 6 minutes.

The time interval of calculation of the SAR values for periods of 10 seconds and 6 minutes is determined by considering that the error increases as the time interval increases, and the electrical power used for the calculation increases as the time interval decreases. For example, the time interval can be maximized as far as the accuracy requirement of calculation of the SAR values is satisfied.

Similarly, the second correcting unit 102 performs the correcting operation by multiplying "the energy value of each of the RF pulses sequentially inputted thereto" by a path coefficient W2, a coil coefficient C2, a region coefficient S2 and a bed coefficient T2. And the second correcting unit 102 sequentially inputs "the corrected energy value (i.e. the energy value after the correction operation)" and "the position information on the bed 32" to the second storage unit 105.

The path coefficient W2 is a value that is involved in measurement of the head and reflects attenuation of the energy of the RF pulses along the path from the RF transmitter 46 to a transmitting RF coil 28.

The coil coefficient C2 is a value that is involved in measurement of the head and reflects consumption of the electrical power of the RF pulses in the whole body coil 28a or the coil elements 28c. In this embodiment, since the bed 32 and the coil elements 28c are in the positional relationship shown in FIGS. 3 and 4 in a period before the time t1, the coil coefficient C2 can be considered to primarily reflect the electrical power consumption in the eight coil elements 28c close to the head enclosed by a dashed line in FIGS. 3 and 4, for example.

The region coefficient S2 is a coefficient of energy attenuation that is involved in measurement of the head.

The bed coefficient T2 is a value to consider attenuation of the energy of the RF pulses before reaching the head that depends on the position of the bed 32.

The second storage unit 105 stores, as intermediate data, the corrected energy value and the position of the bed 32 every measurement time. The corrected energy value is also converted into the above-described reduced value with respect to the upper limit before being stored as intermediate data.

At the predetermined time intervals, the second calculating unit 108 sequentially calculates "the SAR value for 10 seconds just before the current reference time" and "the SAR value for 6 minutes just before the current reference time" by using the intermediate data stored in the second storage unit 105. The second calculating unit 108 sequentially inputs the calculation results to the operation device 60 as SAR values of the head for periods of 10 seconds and 6 minutes.

Similarly, the third correcting unit 103 performs the correcting operation by multiplying "the energy value of each of the RF pulses sequentially inputted thereto" by a path coefficient W3, a coil coefficient C3, a region coefficient S3 and a bed coefficient T3. And the third correcting unit 103 sequentially inputs "the corrected energy value (i.e. the energy value after the correction operation" and "the position information on the bed 32" to the third storage unit 106.

The path coefficient W3 is a value that is involved in measurement of the trunk and reflects attenuation of the energy of the RF pulses along the path from the RF transmitter 46 to a transmitting RF coil 28.

The coil coefficient C3 is a value that is involved in measurement of the trunk and reflects consumption of the electrical power of the RF pulses in the whole body coil 28a or the coil elements 28c. As with the above description, the coil coefficient C3 in the period before the time t1 can be considered to primarily reflect the electrical power consumption in the twenty four coil elements 28c close to the trunk enclosed by an alternate long and short dash line in FIGS. 3 and 4, for example.

The region coefficient S3 is a coefficient of energy attenuation that is involved in measurement of the trunk.

The bed coefficient T3 is a value to consider attenuation of the energy of the RF pulses before reaching the trunk that depends on the position of the bed 32.

The third storage unit 106 stores, as intermediate data, the corrected energy value and the position of the bed 32 every measurement time. The corrected energy value is also converted into the above-described reduced value with respect to the upper limit before being stored as intermediate data.

At the predetermined time intervals, the third calculating unit 109 sequentially calculates "the SAR value for 10 seconds just before the current reference time" and "the SAR value for 6 minutes just before the current reference time" by using the intermediate data stored in the third storage unit 106. The third calculating unit 109 sequentially inputs the calculation results to the operation device 60 as SAR values of the trunk for periods of 10 seconds and 6 minutes.

Figure 6A:
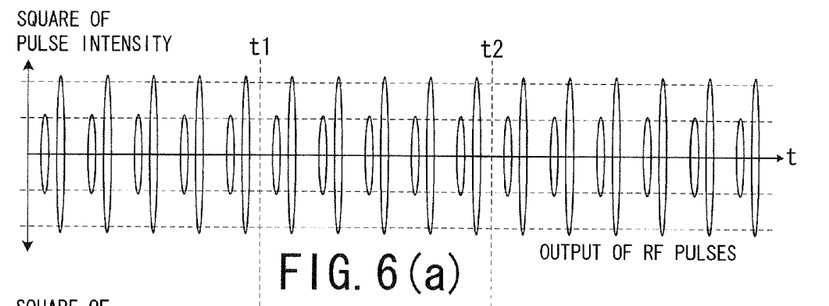
FIG. 6 is a timing chart showing exemplary time variations of "output energy of RF pulse" and "the value of the energy absorbed by parts of the object"
Figure 6B:
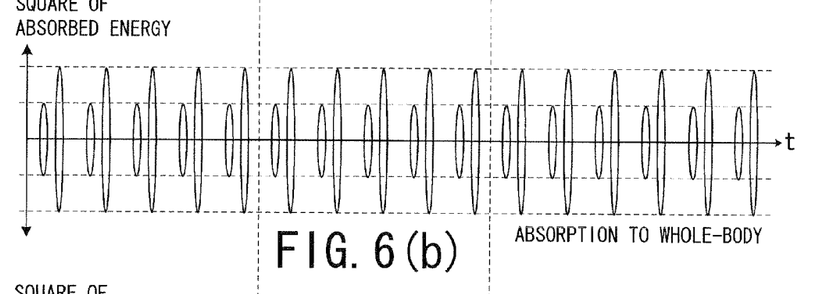
Figure 6C:
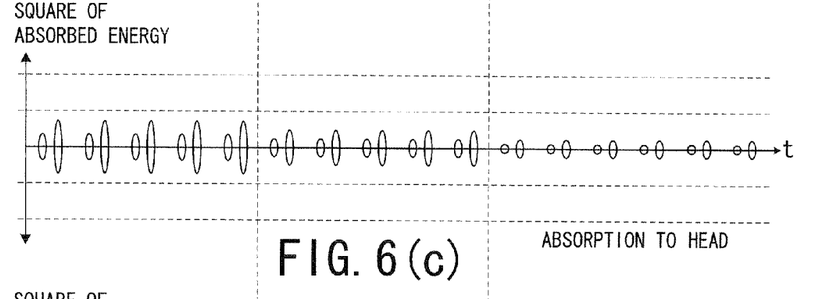
Figure 6D:
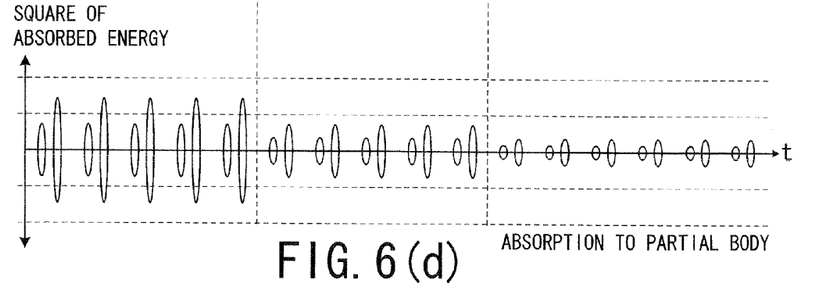

Since SAR is calculated as described above, the energy absorbed by each part until the time t1 is as shown in FIGS. 6(b) to 6(d). Because the absorbed energy is calculated by multiplying the energy of the RF pulses by the path coefficient W1, the coil coefficient C1, the region coefficient S1 and the bed coefficient T1 that are smaller than 1, the energy absorbed by the whole body shown in FIG. 6(b) is lower than the output energy of the RF pulses shown in FIG. 6(a).

In addition, the energy absorbed by the trunk (body part) shown in FIG. 6(d) is lower than the energy absorbed by the whole body shown in FIG. 6(b), and the energy absorbed by the head shown in FIG. 6(c) is lower than the energy absorbed by the trunk.

Most preferably, the first storage unit 104, the second storage unit 105 and the third storage unit 106 store all the intermediate data obtained throughout the entire scan process. However, depending on the storage capacity, all the data do not always have to be stored. Preferably, at least "intermediate data obtained during a predetermined period just before the current reference time" that is longer than the maximum duration of SAR calculation. In this embodiment, since the maximum duration of SAR calculation is 6 minutes, the intermediate data obtained in 6 minutes just before the current reference time is preferably stored, because storing the intermediate data obtained in the 6 minutes is enough to avoid an adverse effect on the calculation of the SAR value for a period of 6 minutes.

Then, at the time t1, the bed 32 moves further into the gantry in the Z axis direction, and thus, the head moves away from the whole body coil 28a. In synchronization with this, the sequence controller updates the position information on the bed 32 inputted to the first correcting unit 101, the second correcting unit 102 and the third correcting unit 103. In this regard, since the bed 32 moves further into the gantry, the possibility that the energy of the RF pulses reaches the head, the trunk and the whole body decreases.

Thus, the first correcting unit 101, the second correcting unit 102 and the third correcting unit 103 set the respective bed coefficients T1, T2 and T3 at values lower than those before the time t1. Then, SAR values are calculated in the way described above, and the calculation results are inputted to the operation device 60.

Therefore, even if the output energy of the RF pulses does not differ from the value before the time t1 as shown in FIG. 6(a), the values of the energy absorbed by the whole body, the head and the trunk after the time t1 are lower than the values before the time t1 as shown in FIGS. 6(b), 6(c) and 6(d) because of the smaller bed coefficients T1, T2 and T3.

Then, at the time t2, the bed 32 moves further into the gantry in the Z axis direction. In synchronization with this, the sequence controller 56 updates the position information on the bed 32 inputted to the first correcting unit 101, the second correcting unit 102 and the third correcting unit 103. In this regard, since the possibility that the energy of the RF pulses reaches the head, the trunk and the whole body further decreases, the first correcting unit 101, the second correcting unit 102 and the third correcting unit 103 set the respective bed coefficients T1, T2 and T3 at values even lower than those before the time t2. Then, SAR values are calculated in the way described above, and the calculation results are inputted to the operation device 60.

Therefore, even if the output energy of the RF pulses does not differ from the value before the time t2 as shown in FIG. 6(athe values of the energy absorbed by the whole body, the head and the trunk after the time t2 are lower than the values before the time t2 as shown in FIGS. 6(b), 6(c) and 6(d).

A method of calculating SAR values has been described above. In this way, scan is carried out while sequentially calculating SAR values in real time.

On the other hand, before starting the next scan, the operation device 60 calculates SAR estimation values for periods of 10 seconds and 6 minutes for the next scan. More specifically, the operation device 60 acquires the intermediate data obtained in the period of the previous scan from the first storage unit 104, the second storage unit 105 and the third storage unit 106 of the SAR calculator 54. Based on the acquired intermediate data and an imaging condition for the next scan, the operation device 60 calculates the SAR estimation values for periods of 10 seconds and 6 minutes for the entire period of the next scan for each of the whole body, the head and the body part.

The operation device 60 judges whether or not the calculated SAR estimation values include a value that exceeds the upper limit prescribed by the safety standard. If there is a value that exceeds the upper limit, the operation device 60 determines a correction option that prevents the SAR estimation values from exceeding the upper limit. Correction options include delaying the start of scan, lowering the RF pulse intensity, reducing the scan duration and reducing the number of slices, for example. The operation device 60 displays the determined correction options on a display device 64 and suspends a command to implement the next scan.

If the operation device 60 judges that there is no SAR estimation value that exceeds the upper limit prescribed by the safety standard, the operation device 60 determines an imaging condition to optimize the next scan. More specifically, the operation device 60 compares "the maximum value of the SAR estimation values for a period of 10 seconds calculated for the entire period of the next scan" and "the maximum value of the SAR estimation values for a period of 6 minutes calculated for the entire period of the next scan" with the respective upper limits prescribed by the safety standard. And the operation device 60 determines whether or not there is a margin of 20% or more, for example, on the assumption that the upper limit is 100%.

If the margin is smaller than 20%, the imaging condition for the next scan is not changed.

If the margin is equal to or greater than 20%, correction options for the imaging condition that makes the maximum value of the SAR estimation values about 95% of the upper limit are determined.

The correction options in this step include increasing the RF pulse intensity, advancing the start of scan, increasing the scan duration and increasing the number of slices, for example. Since the corrected energy value stored as the intermediate data is in the form of a reduced value on the assumption that the upper limit of the SAR value for a period of 6 minutes is 100%, the determination of whether or not there is a margin of 20% or more with respect to the upper limit can be easily made.

The operation device 60 displays the determined correction options for the imaging condition on the display device 64. At the same time, the operation device 60 may suspend the command to implement the next scan. If no correction option is displayed on the display device 64, the next scan is started immediately. If one correction option or plural correction options is/are displayed on the display device 64, an operator sets the imaging condition for the next scan via the input device 66 before the start of the next scan.

Figure 7:
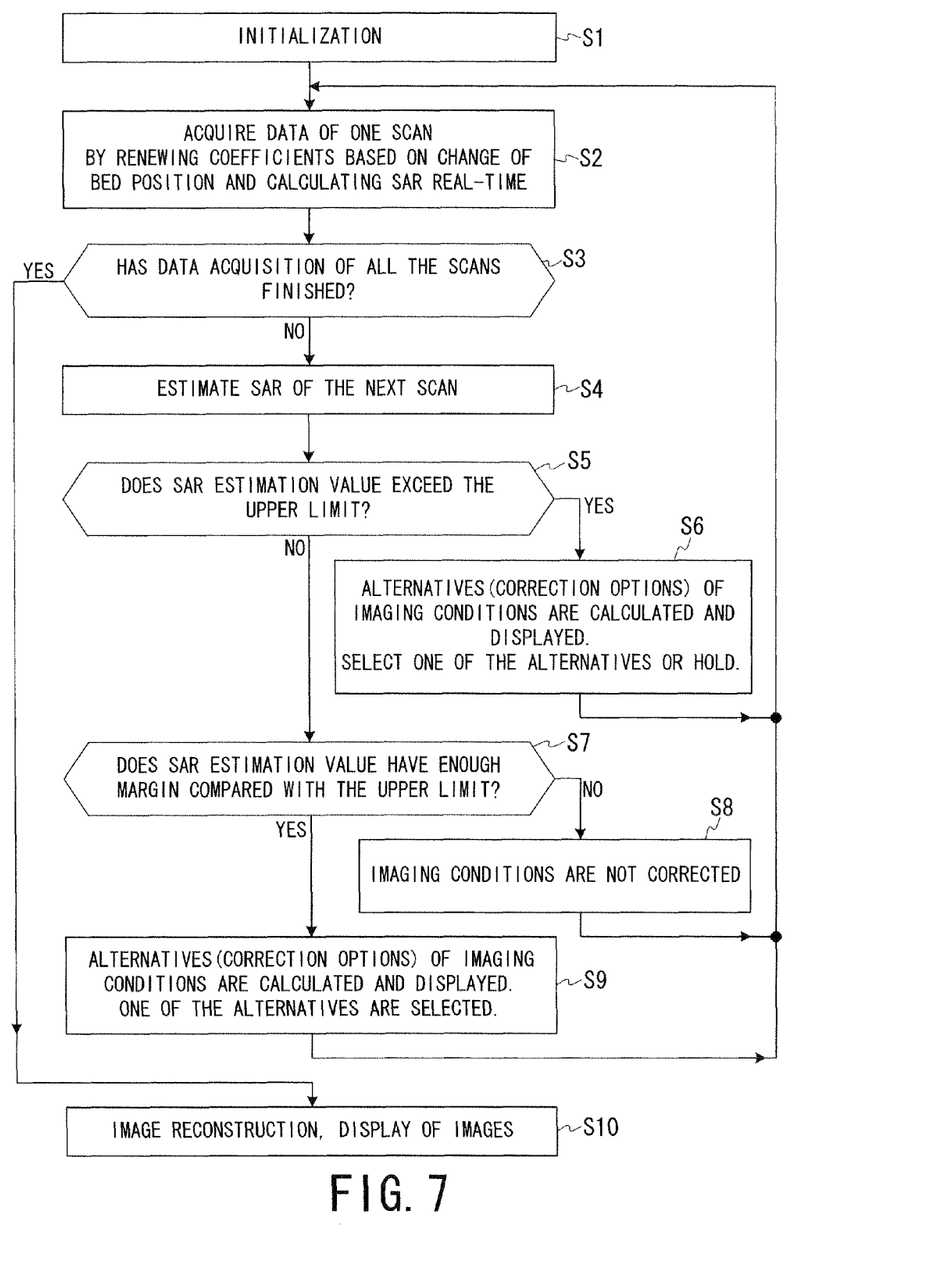
FIG. 7 is a flowchart showing a flow of the imaging condition correcting process in the entire operation of the MRI apparatus.

FIG. 7 is a flowchart showing a flow of the imaging condition correcting process performed by the operation device 60 described above in the entire operation of the MRI apparatus 20. In the following, in order of step numbers shown in FIG. 7, a flow of an operation of the MRI apparatus 20 will be described.

[Step S1] Initial configuration of the MRI apparatus 20 is performed via the input device 66 (see FIG. 1), including setting of the imaging conditions for each scan. Then, the process proceeds to Step S2.

[Step S2] Data collection (reception of an NMR signal and a post-processing) for one scan is performed. In parallel with the data collection, the SAR calculator 54 stores, as intermediate data, a corrected energy value for each measurement time and the position of the bed 32 at the time, sequentially calculates SAR values in real time, and inputs the calculated SAR values to the operation device 60.

In calculation of SAR values, the bed coefficients T1, T2 and T3 are updated as the position of the bed changes, and the corrected energy value is converted into a reduced value with respect to the upper limit of the SAR value for a period of 6 minutes before being stored as the intermediate data. Details of the calculation of SAR values are as described above.

In data collection, other components of the MRI apparatus 20 operate as described below. The static magnetic field magnet 22 produces a static magnetic field in an imaging space, and the shim coil uniforms the static magnetic field. The sequence controller 56 drives a gradient magnetic field power supply 44, the RF transmitter 46, the RF receiver 50 and the like according to the pulse sequence inputted thereto from the operation device 60, thereby causing formation of a gradient magnetic field in the imaging space and making the RF coils 28 producing an RF signal.

As a result, an NMR signal from the object P is received by the RF coils 28 and detected by the RF receiver 50. The RF receiver 50 performs a predetermined signal processing on the detected NMR signal, A/D-converts the processed NMR signal to form raw data, and inputs the raw data to the sequence controller 56. The sequence controller 56 inputs the raw data to the operation device 60, and the operation device 60 records the raw data therein as k-space data.

When data collection for one scan is completed in this way, the process proceeds to Step S3.

[Step S3] The operation device 60 determines whether or not data collection is completed for all scans. If it is judged that data collection for all scans is completed, the process proceeds to Step S10. Otherwise, the process proceeds to Step S4.

[Step S4] The operation device 60 acquires the intermediate data obtained in the period of the previous scan from the first storage unit 104, the second storage unit 105 and the third storage unit 106 of the SAR calculator 54. Then, the operation device 60 calculates "an SAR estimation value for a period of 10 seconds" and "an SAR estimation value for a period of 6 minutes for the next scan". The calculation is performed for each of the whole body, the head and the body part based on the intermediate data and the imaging conditions for the next scan. Then, the process proceeds to Step S5.

[Step S5] The operation device 60 judges whether or not the calculated SAR estimation values for the next scan includes a value that exceeds the upper limit prescribed by the safety standard. If there is a value that exceeds the upper limit, the process proceeds to Step S6. Otherwise, the process proceeds to Step S7.

[Step S6] The operation device 60 determines correction options for the imaging conditions that prevent the SAR estimation values from exceeding the upper limit and displays the correction options on the display device 64. The correction options have been described earlier.

Then, if any of the correction options for the imaging conditions is selected via the input device 66, the process returns to Step S2, and data collection for the next scan is performed under the selected imaging condition.

If none of the correction options is selected, the operation device 60 enters a standby state. When the standby period exceeds a predetermined length of time, the start of scan is delayed, and any SAR estimation value calculated for the next scan no longer exceeds the upper limit. Therefore, if the standby period exceeds the predetermined length of time, the process returns to Step S2, and data collection for the next scan is performed without correcting the imaging conditions except for the time of start of scan.

[Step S7] The operation device 60 compares "the maximum value of the SAR estimation values for a period of 10 seconds calculated for the entire period of the next scan" and "the maximum value of the SAR estimation values for a period of 6 minutes calculated for the entire period of the next scan" with the respective upper limits prescribed by the safety standard. Thereby, the operation device 60 judges whether or not there is a margin of 20% or more, for example, on the assumption that the upper limit is 100%. If the margin is smaller than 20%, the process proceeds to Step S8. If the margin is equal to or greater than 20%, the process proceeds to Step S9.

[Step S8] The operation device 60 does not change the imaging conditions for the next scan. No correction options for the imaging condition are displayed. The process returns to Step S2, and data collection for the next scan is performed.

[Step S9] The operation device 60 determines correction options for the imaging conditions that make the maximum value of the SAR estimation values about 95% of the upper limit, and displays the correction options on the display device 64. The correction options available in this step have been described earlier.

Then, if any of the correction options for the imaging conditions is selected via the input device 66, the process returns to Step S2, and data collection for the next scan is performed under the selected imaging conditions.

If a predetermined time elapses without a selection input after the correction options are displayed, the operation device 60 automatically selects any of the correction options. Then, the process returns to Step S2, and data collection for the next scan is performed under the automatically selected imaging condition.

Alternatively, the correction options for the imaging conditions may not be displayed, and the operation device 60 may automatically select any of the correction options based on a preset order of priority before the process returns to Step S2. For example, top priority can be given to a correction option of increasing the number of slices. The order of priority for the automatic selection can be previously set in Step S1.

[Step S10] The operation device 60 performs an image reconstruction processing including the two-dimensional Fourier transform on the k-space data obtained in all scans, thereby reconstructing the image data. The operation device 60 performs a predetermined image processing on the resulting image data to form two-dimensional display image data and stores the display image data in the storage device 62. Then, based on the display image data, the final image is displayed on a monitor of the display device 64.

An operation of the MRI apparatus 20 according to an embodiment of the present invention is thus described.

(Difference Between Embodiment and Conventional Technique)

Figures 8A, 8B, 8C:
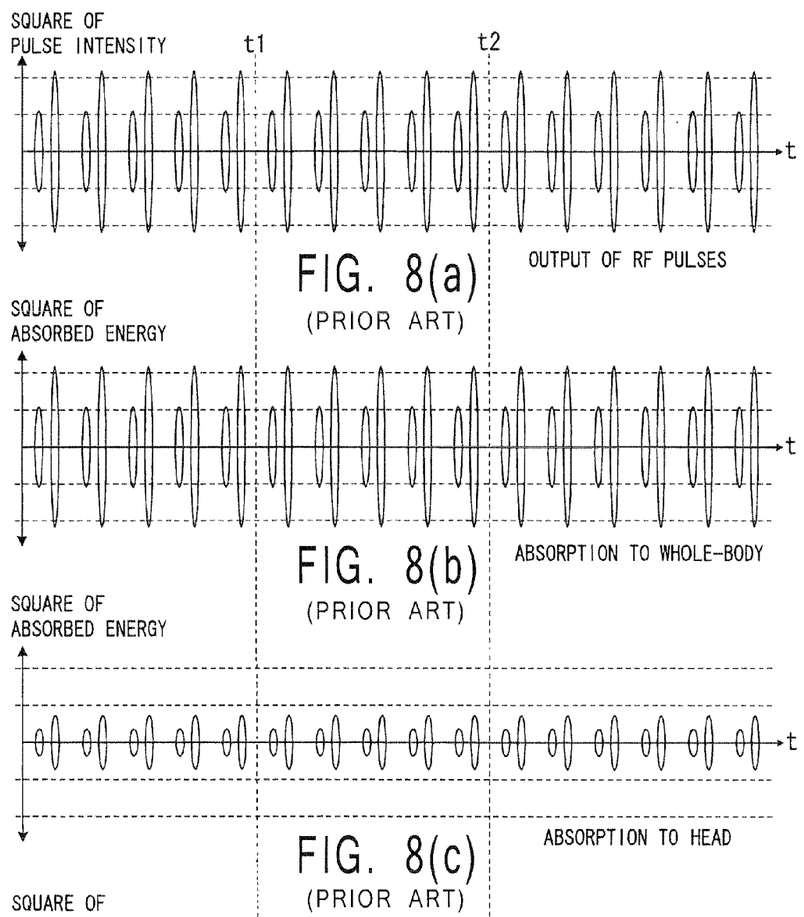
FIG. 8 shows time variations of "output energy of RF pulse" and "the value of the energy absorbed by parts of the object" calculated by conventional technique.
Figure 8D:
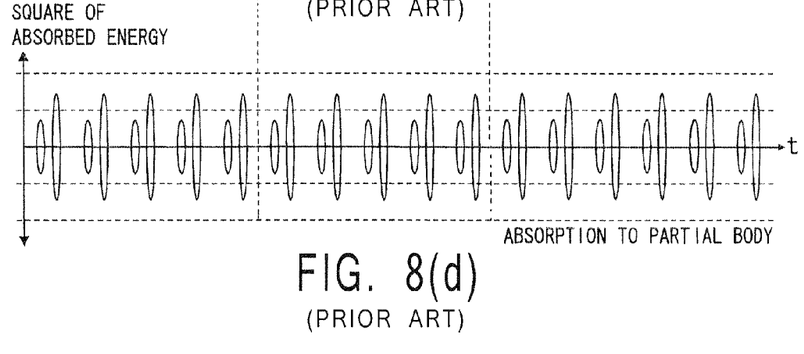

In the same manner as FIG. 6, FIG. 8 shows time variations of the value of the energy absorbed by the whole body, the head and the body part of the object P according to a conventional technique, on the assumptions that the output energy of the RF pulses is the same as that shown in FIG. 6(a) and that the bed moves at the times t1 and t2 as in the above description.

According to the conventional technique, SAR values are calculated without considering the energy attenuation along the path to the transmitting RF coil 28 and the energy consumption in the whole body coil 28a and the coil elements 28c, on the assumption that the bed 32 is fixed during the measurement. In other words, the conventional technique considers only the factors corresponding to the region coefficients S1, S2 and S3 according to this embodiment. As a result, the conventional technique directly regards the output energy of the RF pulses as the energy absorbed by the whole body. Thus, even if the bed moves, the calculation result of the energy absorbed by the whole body or each part of the body does not change as far as the output energy of the RF pulses does not change (see FIGS. 8(b), 8(c) and 8(d)).

However, according to this embodiment, SAR values are calculated by considering not only the difference in absorbed energy among the measurement regions indicated by the region coefficients S1, S2 and S3 but also the following three factors. The three factors include the energy attenuation along the path from the RF transmitter 46 to the transmitting RF coil 28 indicated by the path coefficients W1, W2 and W3, the energy consumption in the whole body coil 28a and the coil elements 28c indicated by the coil coefficients C1, C2 and C3, and the energy attenuation depending on the position of the bed indicated by the bed coefficients T1, T2 and T3. As a result, SAR values can be calculated more accurately than the conventional technique. According to the calculation method according to this embodiment, SAR values can be accurately calculated in real time even in the case where screening imaging is performed to image the whole body of the object P within 6 minutes by moving the bed 32.

In addition, according to this embodiment, information on "the conditions (the elapsed time from the start of scan and the position of the bed 32) under which each absorbed energy value for each part of the body of the object P is obtained" is stored as intermediate data. Therefore, whether or not the SAR values obtained in the next scan exceed the upper limit prescribed by the safety standard can be accurately predicted by retroactive summation.

If an SAR value calculated for the next scan in this way exceeds the upper limit, correction options for the imaging conditions that make the SAR value equal to or lower than the upper limit are determined and displayed on the display device 64. Therefore, the operator can satisfy the safety standard simply by selecting from among the correction options, and thus, the MRI apparatus 20 is improved in usability.

On the other hand, if there is a margin between the upper limit and the maximum value of the SAR values calculated for the next scan, correction options for the imaging conditions, such as increasing the RF pulse intensity in accordance with the margin, are displayed. In this case, the operator can perform imaging under more suitable conditions.

According to the conventional technique, when scans involving transmission of intense RF pulses are successively performed, the upper limit described above is easily exceeded in a scan, and the next scan has to be suspended for a longer time than is required.

However, according to this embodiment, since correction options are determined based on the intermediate data and displayed, the operator can determine that the next scan involving transmission of RF pulses of the same intensity can be started in two minutes, for example. That is, the MRI apparatus 20 does not have to be stopped, and the waiting time can be minimized.

In addition, for example, the transmitting RF coil 28 is distributed on the forward and rearward sides of the bed 32, and only the RF coil 28 on one of the sides is used to transmit the RF pulses. Thereby, the RF pulse energy absorbed by the object P can be reduced. In this case, depending on the imaging region, the RF coils 28 used vary, and the output energy of the RF pulses and the degree of absorption of the RF pulse energy by the object P vary. Even in such a case, according to this embodiment, SAR values can be accurately calculated by appropriately setting the coil coefficients C1, C2 and C3 and the region coefficients S1, S2 and S3.

(Supplementary Notes on Embodiment)

[1] In the embodiment described above, as the correction operation involved in calculation of the energy absorbed by each part of the body, the output energy value of the RF pulses is multiplied by the path coefficient (W1, W2, W3), the coil coefficient (C1, C2, C3), the region coefficient (S1, S2, S3) and the bed coefficient (T1, T2, T3) that are smaller than 1. However, embodiments of the present invention are not limited to this aspect.

The correction operation may involve a division by a coefficient greater than 1.

As an alternative to the multiplication by the path coefficient (W1, W2, W3), a predetermined energy value may be subtracted from the output energy value of the RF pulses. That is, table data may be previously stored, and a predetermined value corresponding to the path coefficient, the coil coefficient, the region coefficient or the bed coefficient may be subtracted from the output energy value of the RF pulses, depending on the magnitude of the energy value of the RF pulses.

[2] In the embodiment described above, the corrected energy value is converted into a reduced value with respect to the upper limit of SAR values for a period of 6 minutes before being stored as intermediate data. However, embodiments of the present invention are not limited to this aspect. For example, the conversion processing may be omitted, and the corrected energy value (in units of J, for example) may be directly stored as intermediate data.

[3] Correspondences between terms used in the claims and terms used in the embodiment described above will be described. Note that the correspondences described below are just some of possible interpretations for reference and should not be construed as limiting the present invention.

The RF receiver 50 that detects an NMR signal and inputs raw data derived from the NMR signal to the sequence controller 56, the sequence controller 56, and the operation device 60 that receives the raw data derived from the NMR signal from the sequence controller 56 and performs a predetermined processing on the raw data to form image data on an MR image are an example of an image generating unit described in the claims.

The following (a) to (c) functions of the operation device 60 are examples of the imaging condition correcting unit described in the claims;

(a) acquiring the intermediate data for the previous scan period;

(b) calculating (estimating) SAR values for the next scan from the intermediate data; and (c) determining correction options for the imaging conditions that prevent the calculated SAR value from exceeding the upper limit, when any of the calculated SAR values exceeds the upper limit prescribed by the safety standard.

The following (d) and (e) functions of the operation device 60 are also examples of the imaging condition correcting unit described in the claims;

(d) calculating an SAR value for the next scan from the intermediate data; and (e) determining correction options for the imaging condition that bring the SAR value closer to the upper limit, when the calculated SAR value has a margin of, for example, 20% or more with respect to the upper limit.

[4] While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetic resonance imaging (MRI) apparatus, comprising:
    an image generating unit configured to receive, from an imaging region of an object, magnetic resonance signals generated as a result of a transmission of an RF pulse and the image generating unit also being configured to generate image data of the object, based on the magnetic resonance signals received;
    an RF output measuring unit coupled to an RF transmitter and configured to measure the RF pulse currently being transmitted and the RF output measuring unit also configured to output an energy control value representative thereof;
    at least one energy control value correcting unit, configured to perform a correction operation, on said energy control value, that was output by the RF output measuring unit, in order to produce a modified energy control value, according to plural imaging conditions which were set before diagnostic MRI data acquisition began; and
    at least one SAR (specific absorption rate) calculating unit configured to calculate at least one SAR value based on the produced modified energy control value;
    wherein the at least one energy control value correcting unit is configured to perform respectively different correction operations, in order to produce the modified energy control value, depending on the imaging region of the object during use of the magnetic resonance imaging apparatus.

2. The magnetic resonance imaging apparatus according to claim 1, wherein:
    the correction operation is performed on the energy control value, which was output by the RF output measuring unit, based, at least in part, on an estimated energy consumption of the transmitted RF pulse in an RF coil that then transmits the RF pulse into the object during use of the magnetic resonance imaging apparatus.

3. The magnetic resonance imaging apparatus according to claim 1, wherein:
    the at least one energy control value correcting unit is configured to perform the correction operation at predetermined time intervals and is configured to store, as intermediate data, an energy control value which was subjected to the correction operation and was obtained during a predetermined period just before a current reference time.

4. The magnetic resonance imaging apparatus according to claim 3, further comprising:
    an imaging condition correcting unit configured for plural successive scans and configured to obtain the intermediate data from the at least one energy control value correcting unit of a prior scan, in order to estimate an SAR value of a next-scheduled one of said scans based on the obtained intermediate data and an imaging condition of the next-scheduled scan, whereby the imaging condition correcting unit determines the imaging condition of the next-scheduled scan, which gives an SAR value not exceeding an upper limit, in a case of the estimated SAR value being larger than the upper limit.

5. The magnetic resonance imaging apparatus according to claim 3, further comprising:

an imaging condition correcting unit configured for plural successive scans and configured to obtain the intermediate data from the at least one energy control value correcting unit of a prior scan, in order to estimate an SAR value of a next-scheduled one of said scans, based on the obtained intermediate data and an imaging condition of the next-scheduled scan, whereby, when the estimated SAR value is lower than an upper limit with a margin, equal to or greater than a predetermined value, in relation to the upper limit, the imaging condition of the next-scheduled scan is determined in such a manner, that the estimated SAR value approaches the upper limit.

6. A magnetic resonance imaging (MRI) apparatus, comprising:

an image generating unit configured to receive, from an imaging region of an object, magnetic resonance signals generated as a result of a transmission of an RF pulse and the image generating unit also being configured to generate image data of the object, based on the magnetic resonance signals received;

an RF output measuring unit coupled to an RF transmitter and configured to measure the RF pulse currently being transmitted and the RF output measuring unit also configured to output an energy control value representative thereof;

at least one energy control value correcting unit, configured to perform a correction operation, on said energy control value, that was output by the RF output measuring unit, in order to produce a modified energy control value, according to plural imaging conditions which were set before diagnostic MRI data acquisition began;

at least one SAR (specific absorption rate) calculating unit configured to calculate at least one SAR value based on the produced modified energy control value; and wherein the correction operation is performed on the energy control value, that was output by the RF output measuring unit, based, at least in part, on an estimated energy attenuation of the transmitted RF pulse along a path from a source of the RF pulse to an RF coil that then transmits the RF pulse into the object during use of the magnetic resonance imaging apparatus.

7. The magnetic resonance imaging apparatus according to claim 6, wherein:

the at least one energy control value correcting unit is configured to perform respectively different correction operations depending on the imaging region of the object during use of the magnetic resonance imaging apparatus.

8. The magnetic resonance imaging apparatus according to claim 6, wherein:

the at least one energy control value correcting unit is configured to perform the correction operation at predetermined time intervals and configured to store, as intermediate data, an energy control value which was subjected to the correction operation and was obtained during a predetermined period just before a current reference time.

9. The magnetic resonance imaging apparatus according to claim 6, wherein:

the correction operation is performed on the energy control value, which was output by the RF output measuring unit, based, at least in part, on an estimated energy consumption of the transmitted RF pulse in an RF coil that then transmits the RF pulse into the object during use of the magnetic resonance imaging apparatus.

10. The magnetic resonance imaging apparatus according to claim 9, wherein:

the at least one energy control value correcting unit is configured to perform respectively different correction operations depending on the imaging region of the object during use of the magnetic resonance imaging apparatus.

11. The magnetic resonance imaging apparatus according to claim 9, wherein:

the at least one energy control value correcting unit is configured to perform the correction operation at predetermined time intervals and configured to store, as intermediate data, an energy control value which was subjected to the correction operation and was obtained during a predetermined period just before a current reference time.

12. The magnetic resonance imaging apparatus according to claim 8, further comprising:

an imaging condition correcting unit configured for plural successive scans and configured to obtain the intermediate data from the at least one energy control value correcting unit of a prior scan, in order to estimate an SAR value of a next-scheduled one of said scans, based on the obtained intermediate data and an imaging condition of the next-scheduled scan, whereby the imaging condition correcting unit determines the imaging condition of the next-scheduled scan, which gives an SAR value not exceeding an upper limit, in a case of the estimated SAR value being larger than the upper limit.

13. The magnetic resonance imaging apparatus according to claim 8, further comprising:

an imaging condition correcting unit configured for plural successive scans and configured to obtain the intermediate data from the at least one energy control value correcting unit of a prior scan, in order to estimate an SAR value of a next-scheduled one of said scans, based on the obtained intermediate data and an imaging condition of the next-scheduled scan, whereby, when the estimated SAR value is lower than an upper limit with a margin, equal to or greater than a predetermined value, in relation to the upper limit, the imaging condition of the next-scheduled scan is determined in such a manner, that the estimated SAR value approaches the upper limit.

14. A magnetic resonance imaging (MRI) apparatus, comprising:

an image generating unit configured to receive, from an imaging region of an object, magnetic resonance signals generated as a result of a transmission of an RF pulse and the image generating unit also being configured to generate image data of the object, based on the magnetic resonance signals received;

an RF coil that transmits the RF pulse into the object on a bed;

an RF output measuring unit coupled to an RF transmitter and configured to measure the RF pulse currently being transmitted and the RF output measuring unit also configured to output an energy control value representative thereof;

at least one energy control value correcting unit, configured to perform a correction operation, on said energy control value, that was output by the RF output measuring unit, in order to produce a modified energy control value, according to plural imaging conditions which were set before diagnostic MRI data acquisition began;

at least one SAR (specific absorption rate) calculating unit that calculates an SAR value based on said modified energy control value, and wherein the at least one energy control value correcting unit is configured to obtain bed position information during use of the magnetic resonance imaging apparatus and is also configured to perform the correction operation on the energy control value, that was output by the RF output measuring unit, based, at least in part, on an estimated energy attenuation depending on the bed position information received during use of the magnetic resonance imaging apparatus.

15. The magnetic resonance imaging apparatus according to claim 14, wherein:
the at least one energy control value correcting unit is configured to perform respectively different correction operations depending on the imaging region of the object during use of the magnetic resonance imaging apparatus.

16. The magnetic resonance imaging apparatus according to claim 14, wherein:
the at least one energy control value correcting unit is configured to perform the correction operation at predetermined time intervals and configured to store, as intermediate data, an energy control value which was subjected to the correction operation and was obtained in a predetermined period preceding a current reference time.

17. The magnetic resonance imaging apparatus according to claim 16, further comprising:
an imaging condition correcting unit configured for plural successive scans and configured to obtain the intermediate data from the at least one energy control value correcting unit of a prior scan, in order to estimate an SAR value of a next-scheduled one of said scans, based on the obtained intermediate data and an imaging condition of the next-scheduled scan, whereby the imaging condition correcting unit determines the imaging condition of the next-scheduled scan, which gives an SAR value not exceeding an upper limit, in a case of the estimated SAR value being larger than the upper limit.

18. The magnetic resonance imaging apparatus according to claim 16, further comprising:
an imaging condition correcting unit configured for plural successive scans and configured to obtain the intermediate data from the at least one energy control value correcting unit of a prior scan, in order to estimate an SAR value of a next-scheduled one of said scans, based on the obtained intermediate data and an imaging condition of the next-scheduled scan, whereby, when the estimated SAR value is lower than an upper limit with a margin, equal to or greater than a predetermined value, in relation to the upper limit, the imaging condition of the next-scheduled scan is determined in such a manner, that the estimated SAR value approaches the upper limit.

* * * * *